United States Patent
Kim et al.

(10) Patent No.: US 7,095,036 B2
(45) Date of Patent: Aug. 22, 2006

(54) ELECTRON BEAM LITHOGRAPHY APPARATUS USING A PATTERNED EMITTER AND METHOD OF FABRICATING THE PATTERNED EMITTER

(75) Inventors: Dong-wook Kim, Seoul (KR); In-kyeong Yoo, Suwon-si (KR); Chang-wook Moon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 86 days.

(21) Appl. No.: 10/795,979

(22) Filed: Mar. 10, 2004

(65) Prior Publication Data

US 2004/0178364 A1    Sep. 16, 2004

(30) Foreign Application Priority Data

Mar. 14, 2003    (KR)    .................... 10-2003-0016017

(51) Int. Cl.
*H01J 37/08*    (2006.01)

(52) U.S. Cl. .............................. 250/492.24; 250/492.1; 250/492.22

(58) Field of Classification Search ........... 250/492.24, 250/396, 492.1, 492.22, 492.3
See application file for complete search history.

(56) References Cited

U.S. PATENT DOCUMENTS

| | | | | |
|---|---|---|---|---|
| 4,053,806 A | * | 10/1977 | Turnbull et al. | 313/388 |
| 4,900,367 A | * | 2/1990 | Gergis | 136/201 |
| 5,589,687 A | * | 12/1996 | Kawata et al. | 250/338.3 |
| 5,644,184 A | * | 7/1997 | Kucherov | 310/306 |
| 5,949,071 A | * | 9/1999 | Ruffner et al. | 250/338.3 |
| 6,476,402 B1 | * | 11/2002 | Yoo | 250/492.24 |
| 6,528,898 B1 | * | 3/2003 | Ikura et al. | 290/1 R |
| 6,740,895 B1 | * | 5/2004 | Yoo | 250/492.24 |
| 6,815,681 B1 | * | 11/2004 | Kim et al. | 250/338.3 |
| 6,818,892 B1 | * | 11/2004 | Etienne et al. | 250/338.3 |
| 2003/0006381 A1 | | 1/2003 | Yoo | 250/492.24 |
| 2003/0091257 A1 | * | 5/2003 | Chakrabarti et al. | 385/2 |

FOREIGN PATENT DOCUMENTS

KR    P 2002-0007963    1/2002

* cited by examiner

*Primary Examiner*—Nikita Wells
*Assistant Examiner*—Anthony Quash
(74) *Attorney, Agent, or Firm*—Lee & Morse, P.C.

(57) ABSTRACT

An electron beam lithography apparatus for providing one-to-one or x-to-one projection of a pattern includes a pyroelectric emitter, which is disposed a predetermined distance apart from a substrate holder, the pyroelectric emitter including a pyroelectric plate having a dielectric plate on a surface thereof and a patterned semiconductor thin film on the dielectric plate facing the substrate holder, a heating source for heating the pyroelectric emitter, and either a pair of magnets disposed beyond the pyroelectric emitter and the substrate holder, respectively, or a deflection unit disposed between the pyroelectric emitter and the substrate holder, to control paths of electrons emitted by the pyroelectric emitter. In operation, when the pyroelectric emitter is heated in a vacuum, electrons are emitted from portions of the pyroelectric plate that are not covered by the patterned semiconductor thin film.

27 Claims, 5 Drawing Sheets

ELECTRON BEAM LITHOGRAPHY APPARATUS USING A PATTERNED EMITTER AND METHOD OF FABRICATING THE PATTERNED EMITTER

BACKGROUND OF THE INVENTION

1. Field of the Invention

The present invention relates to an electron beam lithography apparatus using a patterned emitter and a method of fabricating the patterned emitter. More particularly, the present invention relates to an electron beam lithography apparatus using a pyroelectric plate as an electron beam source, the pyroelectric plate using a dielectric plate as a mask, the dielectric plate having a patterned semiconductor thin film formed thereon, and a method of fabricating a patterned emitter.

2. Description of the Related Art

Conventional large-area electron projection lithography apparatuses include two types: a thermionic electron lithography apparatus and a photocathode electron projection apparatus. The thermionic electron lithography apparatus controls electron beams using electric and magnetic fields. However, to attain a large-area electron source, it is necessary to provide a separate apparatus having a complex structure to maintain spirally dispersing electron beams in a parallel relation. The photocathode electron projection apparatus is extremely sensitive to airborne contamination, which makes it quite difficult to commercialize.

Recently, a conventional projection apparatus using an electron beam source wherein electrons are emitted from a portion of an emitter exposed by a mask formed on a pyroelectric plate has been developed. In such a conventional arrangement, however, a metal film, which is relatively difficult to etch, is used to shield electron beams. Disadvantageously, the pyroelectric plate may be contaminated by photoresist during patterning of the metal film formed on the pyroelectric plate. Moreover, the metal film is prone to thermal damage during heating.

SUMMARY OF THE INVENTION

In an effort to solve at least some of the above-mentioned problems, the present invention provides an electron beam lithography apparatus using a patterned emitter having a patterned semiconductor thin film as a mask.

The present invention also provides a method of fabricating a patterned emitter that includes disposing a separately fabricated patterned mask on a pyroelectric plate.

According to a feature of the present invention, an embodiment of the present invention includes an electron beam lithography apparatus for providing a one-to-one projection of a pattern including a pyroelectric emitter, which is disposed a predetermined distance apart from a substrate holder, the pyroelectric emitter including a pyroelectric plate having a dielectric plate on a surface thereof and a patterned semiconductor thin film on the dielectric plate facing the substrate holder, a heating source for heating the pyroelectric emitter, and a pair of magnets disposed beyond the pyroelectric emitter and the substrate holder, respectively, to control paths of electrons emitted by the pyroelectric emitter.

Each of the pair of magnets may be an electromagnet or a permanent magnet.

According to another embodiment of the present invention, an electron beam lithography apparatus for providing an x-to-one projection of a pattern includes a pyroelectric emitter, which is disposed a predetermined distance apart from a substrate holder, the pyroelectric emitter including a pyroelectric plate having a dielectric plate on a surface thereof and a patterned semiconductor thin film on the dielectric plate facing the substrate holder, a heating source for heating the pyroelectric emitter, and a deflection unit disposed between the pyroelectric emitter and the substrate holder to control paths of electrons emitted by the pyroelectric emitter.

The deflection unit may include deflection plates for deflecting electrons emitted from the pyroelectric emitter and at least one magnetic lens for focusing the deflected electrons.

The apparatus of either embodiment may further include an adhesion layer having a predetermined thickness between the pyroelectric plate and the dielectric plate. The heating source may be a contact-type heating plate using resistive-type heating or a remotely controlled heater that generates infrared rays.

According to another feature of the present invention, an embodiment of the present invention includes a method of fabricating a pyroelectric emitter, which is disposed a predetermined distance apart from a substrate holder, the pyroelectric emitter including a pyroelectric plate having a dielectric plate on a surface thereof and a patterned semiconductor thin film on the dielectric plate facing the substrate holder, the method including preparing a pyroelectric plate, preparing a patterned mask by forming a patterned semiconductor thin film on a dielectric plate having a predetermined thickness, and disposing the patterned mask on the pyroelectric plate.

In the method, preparing the patterned mask may include sequentially forming a semiconductor thin film having a predetermined thickness and a resist on the dielectric plate having the predetermined thickness, patterning the resist in a predetermined pattern, patterning the semiconductor thin film using the patterned resist as a mask, and removing the patterned resist. Disposing the patterned mask on the pyroelectric plate may include forming an adhesion layer on the pyroelectric plate and adhering the patterned mask on the adhesion layer.

In the embodiments of the present invention, the pyroelectric plate may be formed of a pyroelectric material selected from the group consisting of $LiNbO_3$, $LiTaO_3$, $BaTiO_3$, and $Pb(Zr, Ti)O_3$. The dielectric plate may be a sapphire plate and may have a thickness in a range of about 0.1 to about 1 mm. The semiconductor thin film may be a silicon thin film and may have a thickness in a range of about 100 to about 10,000 Å.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
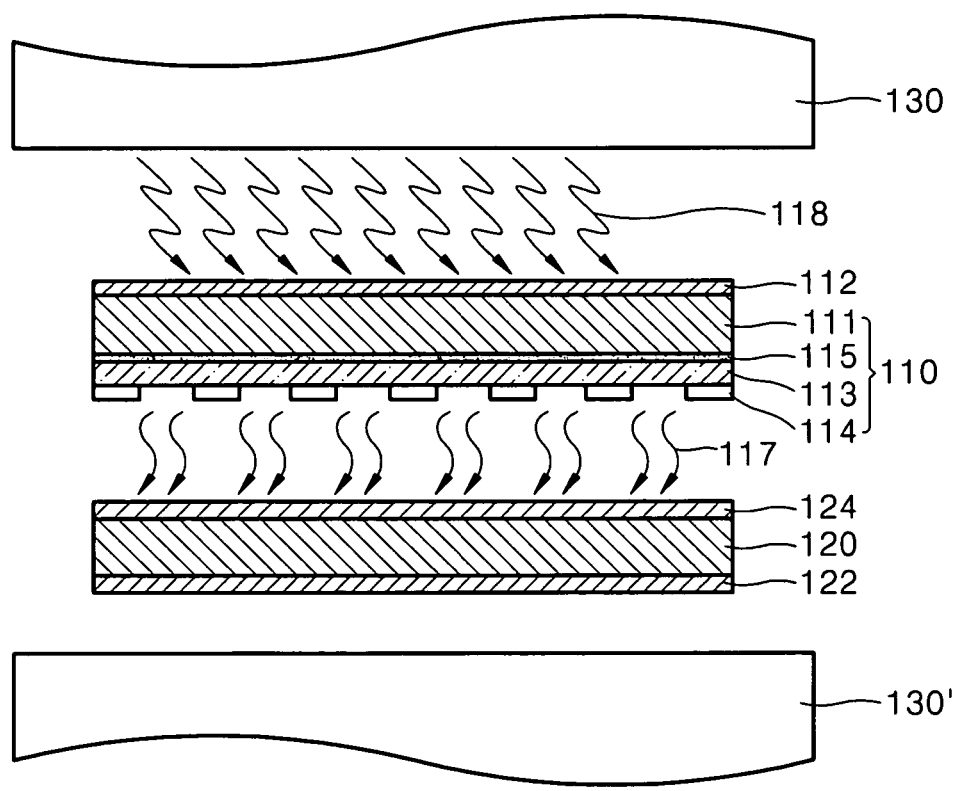
FIG. 1 illustrates a schematic cross-sectional view of an electron beam lithography apparatus for providing a one-to-one projection of a pattern according to a first embodiment of the present invention.

Korean Patent Application No. 2003-16017, filed on Mar. 14, 2003, and entitled: "Electron Beam Lithography Apparatus Using a Patterned Emitter and Fabricating Method of the Patterned Emitter," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

FIG. 1 illustrates a schematic cross-sectional view of an electron beam lithography apparatus for providing a one-to-one projection of a pattern according to a first embodiment of the present invention.

Referring to FIG. 1, a substrate 120 is coated with an electron resist 124 and is disposed on a substrate holder 122. A pyroelectric emitter 110 is mounted on an emitter mount 112 a predetermined distance apart from the substrate holder 122. When heated in a vacuum, the pyroelectric emitter 110 emits electron beams 117.

The pyroelectric emitter 110 has a stacked structure in which a pyroelectric plate 111 is disposed adjacent to the emitter mount 112, a dielectric plate 113 is stacked on the pyroelectric plate 111, and a semiconductor thin film 114, which is formed in a predetermined pattern, is disposed on the dielectric plate 113. Preferably, an adhesion layer 115 having a predetermined thickness is formed between the pyroelectric plate 111 and the dielectric plate 113 to bond the pyroelectric plate 111 and the dielectric plate 113.

The pyroelectric plate 111 is heated by a heating source 118, such as a contact-type heating plate using resistive-type heating or a remotely controlled heater that generates infrared rays.

A pair of magnets 130 and 130', which may be electromagnets or permanent magnets, for controlling a path of each of the electron beams 117 emitted from the pyroelectric emitter 110, are disposed beyond the pyroelectric emitter 110 and the substrate holder 122, respectively.

The pyroelectric plate 111 that emits electrons when heated by the heating source 118 in a vacuum may be formed of a pyroelectric material, such as $LiNbO_3$, $LiTaO_3$, $BaTiO_3$, or $Pb(Zr, Ti)O_3$.

The semiconductor thin film 114 is preferably formed of silicon, which is readily prepared, inexpensive and widely used in semiconductor processing. The semiconductor thin film 114 is preferably formed to a thickness of about 100 to 10,000 Å.

The dielectric plate 113 is preferably formed of sapphire to a thickness of about 0.1 to 1 mm.

Figure 2:
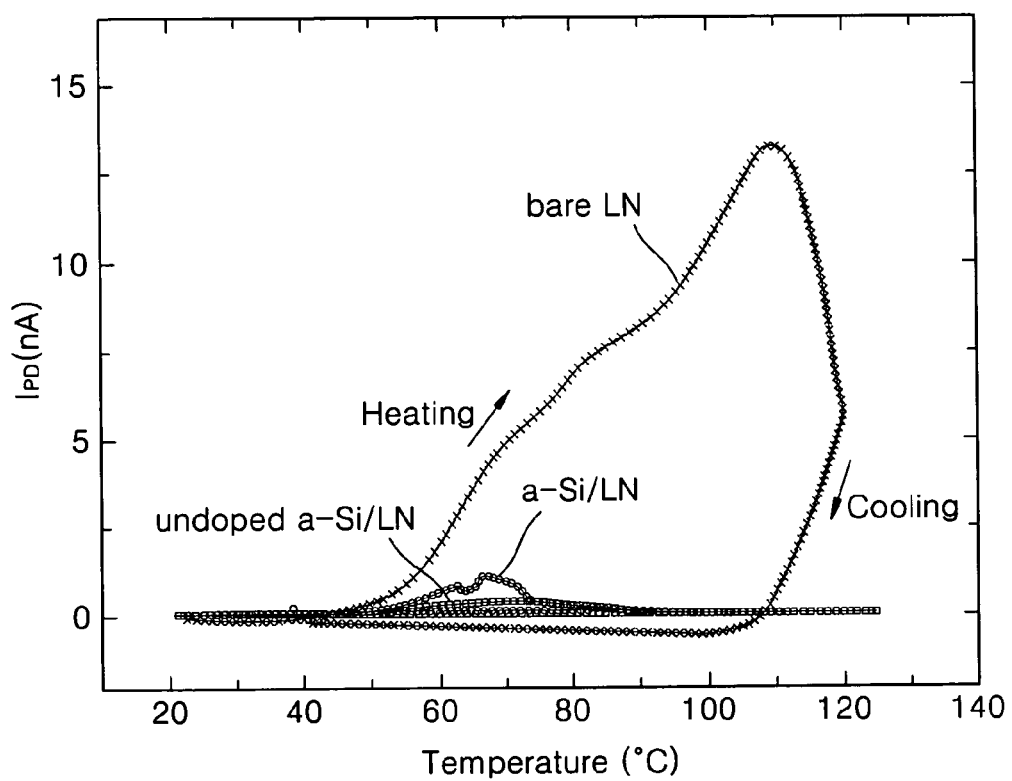
FIG. 2 is a graph of current versus temperature showing values of current produced from a plate formed of $LiNbO_3$ depending on a presence or an absence of a silicon film provided on the plate when the plate is heated from room temperature to a temperature of about 120° C. and then cooled to room temperature.

FIG. 2 is a graph of current versus temperature showing values of current produced from a 1 mm thick pyroelectric plate 111 formed of $LiNbO_3$ when heated, depending on a presence or an absence of a silicon film provided on the pyroelectric plate 111.

Referring to FIG. 2, when the pyroelectric plate having no silicon thin film deposited thereon (represented by a line "bare LN" in FIG. 2) is heated from room temperature to a temperature of about 120° C. and then cooled to room temperature, electrons are emitted from the pyroelectric plate after the pyroelectric plate reaches a temperature of about 50° C. An electron dose sufficient for patterning an electron resist is achieved at a temperature of about 110° C.

As may be seen in FIG. 2, when an amorphous silicon thin film having a thickness of about 500 Å is deposited on the pyroelectric plate 111 (represented by a line "a-Si/LN" in FIG. 2) and when an undoped amorphous silicon thin film is deposited on the pyroelectric plate 111 (represented by a line "undoped a-Si/LN" in FIG. 2), almost no electrons are emitted from the pyroelectric plate 111 even during heating. Accordingly, these results suggest that the presence of a silicon thin film prevents the emission of electrons.

An operation of the electron beam lithography apparatus for providing a one-to-one projection of a pattern according to the first embodiment of the present invention will now be described. First, the substrate 120 having the electron resist 124 coated thereon is mounted on the substrate holder 122 and the pyroelectric emitter 110 is then heated. If the pyroelectric plate 111 is heated to a predetermined temperature, e.g., 110° C., by the heating source 118 in a vacuum, e.g., $2 \times 10^{-5}$ torr or less, the electron beams 117 are emitted from portions of the pyroelectric plate 111 that are exposed by the patterned semiconductor thin film 114. The emitted electron beams 117 move toward the substrate 120 in a relatively straight direction due to a DC magnetic field of about 0.8 Tesla produced by the electromagnets or permanent magnets 130 and 130' to pattern the electron resist 124 on the substrate 120. Here, the pattern of the pyroelectric emitter 110, formed by the semiconductor thin film 114, is projected onto the substrate 120 in a one-to-one ratio. For repeated projection cycles, the pyroelectric emitter 110 is repeatedly heated and cooled.

Although the above-described first embodiment illustrates the pyroelectric emitter 110 mounted on the emitter mount 112, a heating plate may be used instead of the emitter mount 112.

Figure 3:
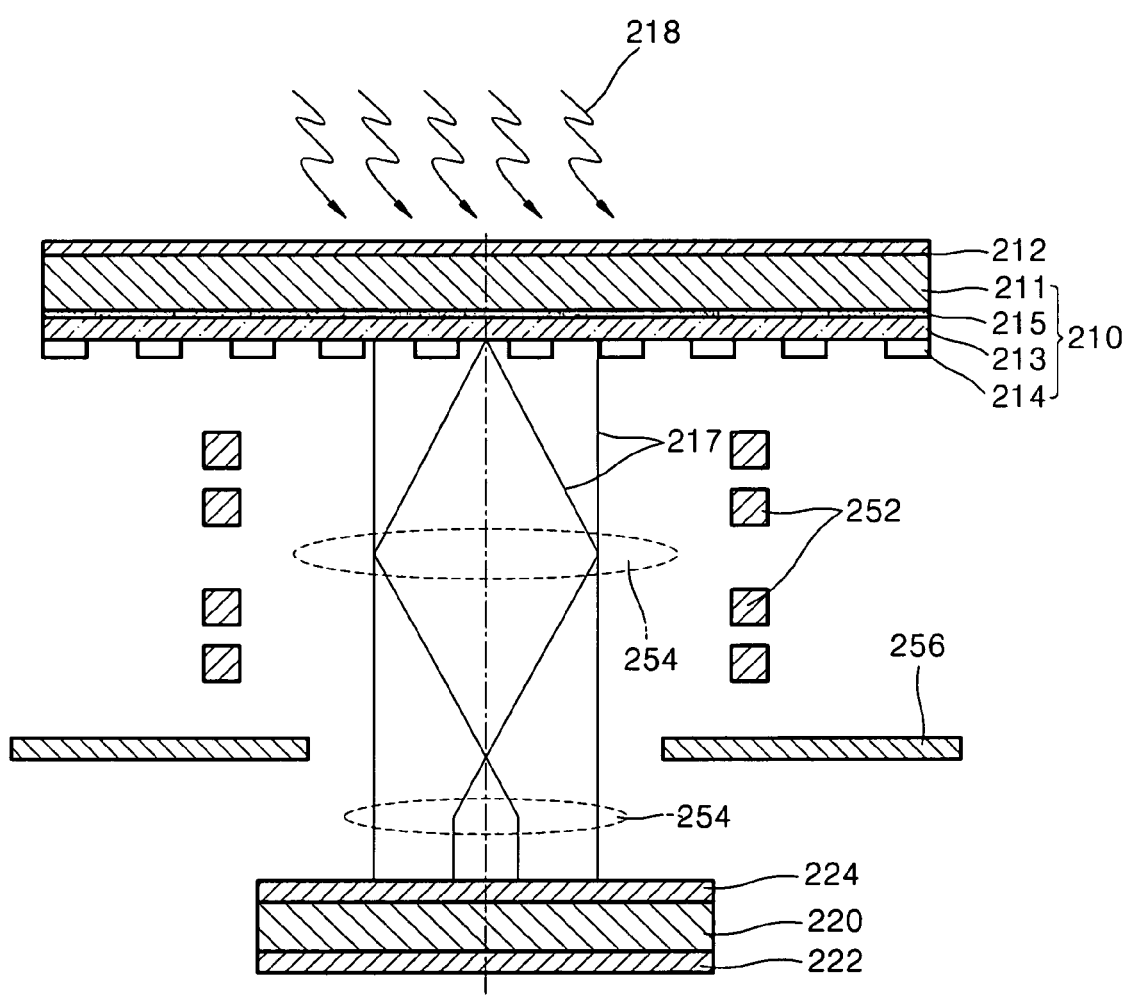
FIG. 3 illustrates a schematic cross-sectional view of an electron beam lithography apparatus for providing an x-to-one projection of a pattern according to a second embodiment of the present invention.

FIG. 3 illustrates a schematic cross-sectional view of an electron beam lithography apparatus for providing an x-to-one projection of a pattern according to a second embodiment of the present invention. A detailed explanation of the elements common to the first embodiment will be omitted.

Referring to FIG. 3, a substrate 220 is coated with an electron resist 224 and is disposed on a substrate holder 222. A pyroelectric emitter 210 is mounted on an emitter mount 212 a predetermined distance apart from the substrate holder 222. When heated in a vacuum, the pyroelectric emitter 210 emits electron beams 217.

The pyroelectric emitter 210 has a stacked structure in which a pyroelectric plate 211 is disposed adjacent to the emitter mount 212, a dielectric plate 213 is stacked on the pyroelectric plate 211, and a semiconductor thin film 214, which is patterned in a predetermined pattern, is disposed on the dielectric plate 213. Preferably, an adhesion layer 215 having a predetermined thickness is formed between the pyroelectric plate 211 and the dielectric plate 213 to bond the pyroelectric plate 211 and the dielectric plate 213.

The pyroelectric plate 211 is heated by a heating source 218, such as a contact-type heating plate using resistive-type heating or a remotely controlled heater that generates infrared rays.

Deflection plates 252, magnetic lenses 254, and an aperture 256, all of which may be collectively referred to as a deflection unit, are disposed between the pyroelectric emitter 210 and the substrate holder 222. In operation, the deflection plates 252 deflect the electron beams 217 emitted from the pyroelectric emitter 210, the magnetic lenses 254, which are disposed on the deflection plates 252, focus the deflected electron beams, and the aperture 256 passes electron beams focused by the magnetic lenses 254 and filters out electrons drifting away from the focused electron beams.

The pyroelectric plate 211 that emits electrons when heated by the heating source 218 in a vacuum may be formed of a pyroelectric material, such as $LiNbO_3$, $LiTaO_3$, $BaTiO_3$, or $Pb(Zr, Ti)O_3$.

The semiconductor thin film 214 is preferably formed of silicon, which is readily prepared, inexpensive and widely used in semiconductor processing. The semiconductor thin film 214 is preferably formed to a thickness of about 100 to 10,000 Å.

The dielectric plate 213 is preferably formed of sapphire to a thickness of about 0.1 to 1 mm.

An operation of the electron beam lithography apparatus for providing an x-to-one projection of a pattern according to the second embodiment of the present invention will now be described. First, the substrate 220 having the electron resist 224 coated thereon is mounted on the substrate holder 222 and the pyroelectric emitter 210 is then heated. If the pyroelectric plate 211 is heated to a predetermined temperature, e.g., 110° C., by the heating source 218 in a vacuum, e.g., $2 \times 10^{-5}$ torr or less, the electron beams 217 are emitted from portions of the pyroelectric plate 211 that are exposed by the patterned semiconductor thin film 214. The emitted electron beams 217 are focused by the deflection plates 252 and the magnetic lenses 254 so that a size of an emitter pattern is reduced to a predetermined ratio, i.e., an x-to-one ratio.

Although the above-described second embodiment illustrates the pyroelectric emitter 210 mounted on the emitter mount 212, a heating plate may be used instead of the emitter mount 212.

FIGS. 4A through 4E illustrate cross-sectional views of stages in a method of fabricating a patterned pyroelectric emitter as an electron source according to an embodiment of the present invention.

First, a pyroelectric plate (411 of FIG. 4E) having a predetermined thickness, e.g., 1 mm, is prepared using a pyroelectric material, such as $LiNbO_3$, $LiTaO_3$, $BaTiO_3$, or $Pb(Zr, Ti)O_3$.

Subsequently, a patterned mask (440 of FIG. 4D) is prepared as follows.

Figure 4A:
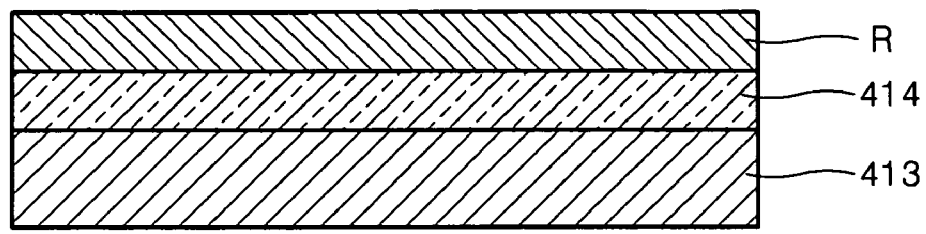
FIGS. 4A through 4E illustrate cross-sectional views of stages in a method of fabricating a patterned pyroelectric emitter as an electron source according to an embodiment of the present invention.

Referring to FIG. 4A, a semiconductor thin film 414, e.g., a silicon thin film, is deposited on a dielectric plate 413, e.g., a sapphire plate, having a thickness of about 0.1 to 1 mm, to a thickness in a range of about 100 to 10,000 Å. Then, a resist R is coated on the semiconductor thin film 414.

Figure 4B:
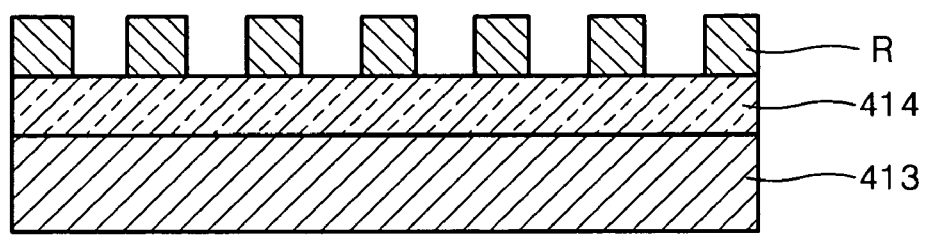

Next, as shown in FIG. 4B, the resist R is patterned by exposure and development using a photolithography or electron beam lithography process.

Figure 4C:
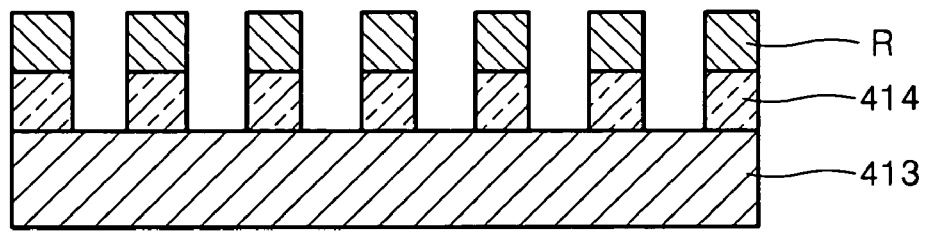

As shown in FIG. 4C, the semiconductor thin film 414 is patterned by reactive ion etching (RIE) using the patterned resist R as the patterned mask 440.

Figure 4D:
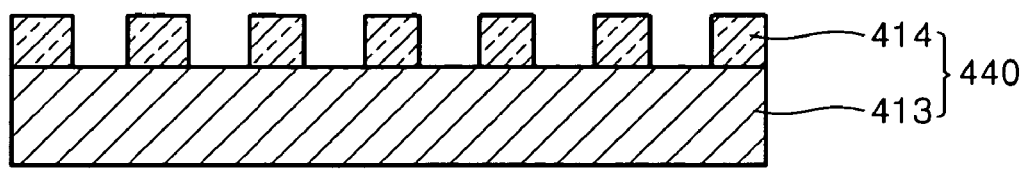

The resist R remaining after the patterning is removed, thereby completing the pattern of the semiconductor thin film 414, as shown in FIG. 4D.

Figure 4E:
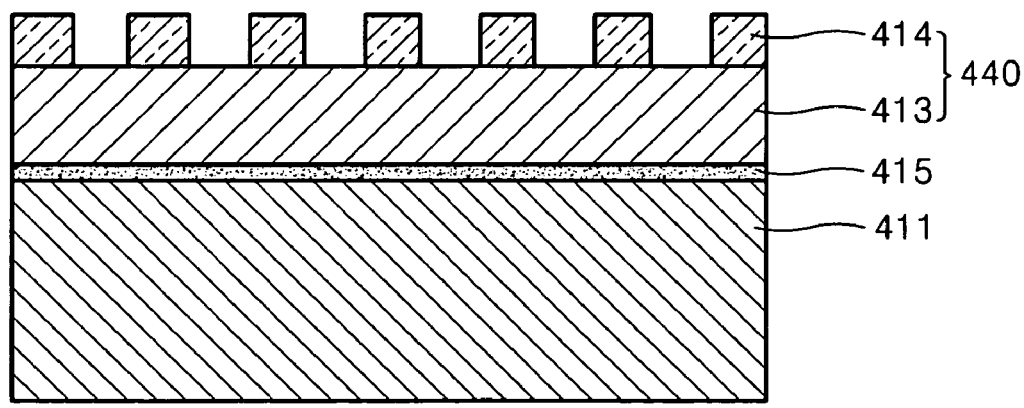

Referring to FIG. 4E, the patterned mask 440 is disposed on the pre-fabricated pyroelectric plate 411, thereby completing fabrication of the patterned emitter as an electron beam source. The patterned mask 440 and the pyroelectric plate 411 are preferably adhered to each other using an adhesion layer 415 of an adhesive agent, e.g., an epoxy resin.

As described above, in an electron beam lithography apparatus using a patterned emitter, a semiconductor thin film patterned on a dielectric plate is used as a mask. Upon heating the emitter, electrons are not emitted from a portion of the emitter covered by the semiconductor thin film and are only emitted from an exposed portion of the emitter that is not covered by the semiconductor thin film. Thus, the shape of the emitter pattern is projected onto a substrate. The electron beams emitted from the emitter can be controlled using a magnet or a deflection unit, thereby achieving a one-to-one or an x-to-one projection. In addition, since a pyroelectric plate and a patterned mask are separately prepared and then adhered to each other, a patterned emitter may be fabricated relatively easily. Further, since it is not necessary to form a metal film for shielding electron beams on the pyroelectric plate, contamination of the pyroelectric plate due to photoresist during patterning of the metal film, can be avoided.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electron beam lithography apparatus for providing a one-to-one projection of a pattern, comprising:
 a pyroelectric emitter, which is disposed a predetermined distance apart from a substrate holder, the pyroelectric emitter including a pyroelectric plate having a dielectric plate on a surface thereof and a patterned semiconductor thin film on the dielectric plate facing the substrate holder;
 a heating source for heating the pyroelectric emitter; and
 a pair of magnets disposed beyond the pyroelectric emitter and the substrate holder, respectively, to control paths of electrons emitted by the pyroelectric emitter.

2. The apparatus as claimed in claim 1, wherein each of the pair of magnets is an electromagnet or a permanent magnet.

3. The apparatus as claimed in claim 1, further comprising an adhesion layer having a predetermined thickness between the pyroelectric plate and the dielectric plate.

4. The apparatus as claimed in claim 1, wherein the heating source is a contact-type heating plate using resistive-type heating.

5. The apparatus as claimed in claim 1, wherein the heating source is a remotely controlled heater that generates infrared rays.

6. The apparatus as claimed in claim 1, wherein the pyroelectric plate is formed of a pyroelectric material selected from the group consisting of $LiNbO_3$, $LiTaO_3$, $BaTiO_3$, and $Pb(Zr,Ti)O_3$.

7. The apparatus as claimed in claim 1, wherein the dielectric plate is a sapphire plate.

8. The apparatus as claimed in claim 1, wherein the dielectric plate has a thickness in a range of about 0.1 to about 1 mm.

9. The apparatus as claimed in claim 1, wherein the semiconductor thin film is a silicon thin film.

10. The apparatus of claim 1, wherein the semiconductor thin film has a thickness in a range of about 100 to about 10,000 Å.

11. An electron beam lithography apparatus for providing an x-to-one projection of a pattern, comprising:
    a pyroelectric emitter, which is disposed a predetermined distance apart from a substrate holder, the pyroelectric emitter including a pyroelectric plate having a dielectric plate on a surface thereof and a patterned semiconductor thin film on the dielectric plate facing the substrate holder;
    a heating source for heating the pyroelectric emitter; and
    a deflection unit disposed between the pyroelectric emitter and the substrate holder to control paths of electrons emitted by the pyroelectric emitter.

12. The apparatus as claimed in claim 11, further comprising an adhesion layer having a predetermined thickness between the pyroelectric plate and the dielectric plate.

13. The apparatus as claimed in claim 11, wherein the deflection unit comprises:
    deflection plates for deflecting electrons emitted from the pyroelectric emitter; and
    at least one magnetic lens for focusing the deflected electrons.

14. The apparatus as claimed in claim 11, wherein the heating source is a contact-type heating plate using resistive-type heating.

15. The apparatus as claimed in claim 11, wherein the heating source is a remotely controlled heater that generates infrared rays.

16. The apparatus as claimed in claim 11, wherein the pyroelectric plate is formed of a pyroelectric material selected from the group consisting of $LiNbO_3$, $LiTaO_3$, $BaTiO_3$, and $Pb(Zr,Ti)O_3$.

17. The apparatus as claimed in claim 11, wherein the dielectric plate is a sapphire plate.

18. The apparatus as claimed in claim 11, wherein the dielectric plate has a thickness in a range of about 0.1 to about 1 mm.

19. The apparatus as claimed in claim 11, wherein the semiconductor thin film is a silicon thin film.

20. The apparatus as claimed in claim 11, wherein the semiconductor thin film has a thickness in a range of about 100 to about 10,000 Å.

21. A method of fabricating an electron beam lithography apparatus, comprising:
    preparing a pyroelectric plate;
    preparing a patterned mask of a semiconductor material, including sequentially forming a semiconductor thin film having a predetermined thickness and a resist on a dielectric plate having the predetermined thickness, patterning the resist in a predetermined pattern, patterning the semiconductor thin film using the patterned resist as a mask, and removing the patterned resist, the semiconductor material being sufficiently thick in desired portions to prevent electrons emitted by the pyroelectric plate during heating from being further transmitted;
    disposing the patterned mask adjacent the surface of the pyroelectric plate;
    providing a heating source for heating the pyroelectric emitter; and
    providing a pair of magnets disposed beyond the pyroelectric emitter and the substrate holder, respectively, to control paths of electrons emitted by the pyroelectric emitter.

22. The method as claimed in claim 21, wherein disposing the patterned mask adjacent the pyroelectric plate comprises forming an adhesion layer on the pyroelectric plate and adhering the patterned mask on the adhesion layer.

23. The method as claimed in claim 21, wherein the pyroelectric plate is formed of a pyroelectric material selected from the group consisting of $LiNbO_3$, $LiTaO_3$, $BaTiO_3$, and $Pb(Zr,Ti)O_3$.

24. The method as claimed in claim 21, wherein the patterned mask is on a dielectric plate.

25. The method as claimed in claim 24, wherein the dielectric plate is formed to a thickness in a range of about 0.1 to about 1 mm.

26. The method as claimed in claim 21, wherein the semiconductor material is silicon.

27. The method as claimed in claim 21, wherein the semiconductor material is formed to a thickness in a range of about 100 to about 10,000 Å.

* * * * *